US008207560B2

(12) United States Patent
Kajimoto

(10) Patent No.: US 8,207,560 B2
(45) Date of Patent: Jun. 26, 2012

(54) NONVOLATILE SEMICONDUCTOR MEMORY DEVICE AND METHOD OF FABRICATING THE SAME

(75) Inventor: Minori Kajimoto, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 602 days.

(21) Appl. No.: 11/873,104

(22) Filed: Oct. 16, 2007

(65) Prior Publication Data

US 2008/0087943 A1    Apr. 17, 2008

(30) Foreign Application Priority Data

Oct. 16, 2006  (JP) .................... 2006-281522

(51) Int. Cl.
  *H01L 29/76* (2006.01)
(52) U.S. Cl. .. 257/288; 257/390; 257/900; 257/E29.129
(58) Field of Classification Search .................. 257/288, 257/315, 320, 321, 390, 391, 900, E29.129, 257/E29.3, E29.304, E29.128, E29.132
See application file for complete search history.

(56) References Cited

U.S. PATENT DOCUMENTS

| | | | |
|---|---|---|---|
| 6,555,865 B2 | 4/2003 | Lee et al. | |
| 6,720,612 B2 | 4/2004 | Takeuchi et al. | |
| 6,818,504 B2 | 11/2004 | Rabkin et al. | |
| 6,894,341 B2 | 5/2005 | Sugimae et al. | |
| 2003/0011017 A1* | 1/2003 | Lee et al. ...................... | 257/314 |
| 2003/0181005 A1* | 9/2003 | Hachimine et al. ........... | 438/231 |
| 2003/0181028 A1* | 9/2003 | Yeap et al. .................... | 438/595 |
| 2006/0017111 A1 | 1/2006 | Kamiya et al. | |
| 2006/0038218 A1 | 2/2006 | Yaegashi et al. | |
| 2006/0205148 A1* | 9/2006 | Deppe et al. .................. | 438/257 |
| 2006/0263958 A1 | 11/2006 | Kajimoto et al. | |
| 2007/0287258 A1* | 12/2007 | Yoon et al. .................... | 438/301 |

FOREIGN PATENT DOCUMENTS

JP    2000-36491    2/2000

* cited by examiner

*Primary Examiner* — Benjamin Sandvik
*Assistant Examiner* — Leslie Pilar Cruz
(74) *Attorney, Agent, or Firm* — Oblon, Spivak, McClelland, Maier & Neustadt, L.L.P.

(57) ABSTRACT

A nonvolatile semiconductor memory device includes a gate electrode formed on a gate insulating film, a source/drain region formed at each side of the gate electrode and including a first region, a second region and a third region located between the first and second regions, a first silicon oxide film formed on a sidewall of the gate electrode, a second silicon oxide film formed on the third region, and a silicon nitride film formed on an upper surface of the second silicon oxide film. The first silicon oxide film, the second silicon oxide film having the silicon nitride film, and a contact plug are contiguously arranged on the first, third and second regions of the source/drain region. The contact plug extends through the second silicon oxide film and the second nitride file to contact the source/drain region.

12 Claims, 14 Drawing Sheets

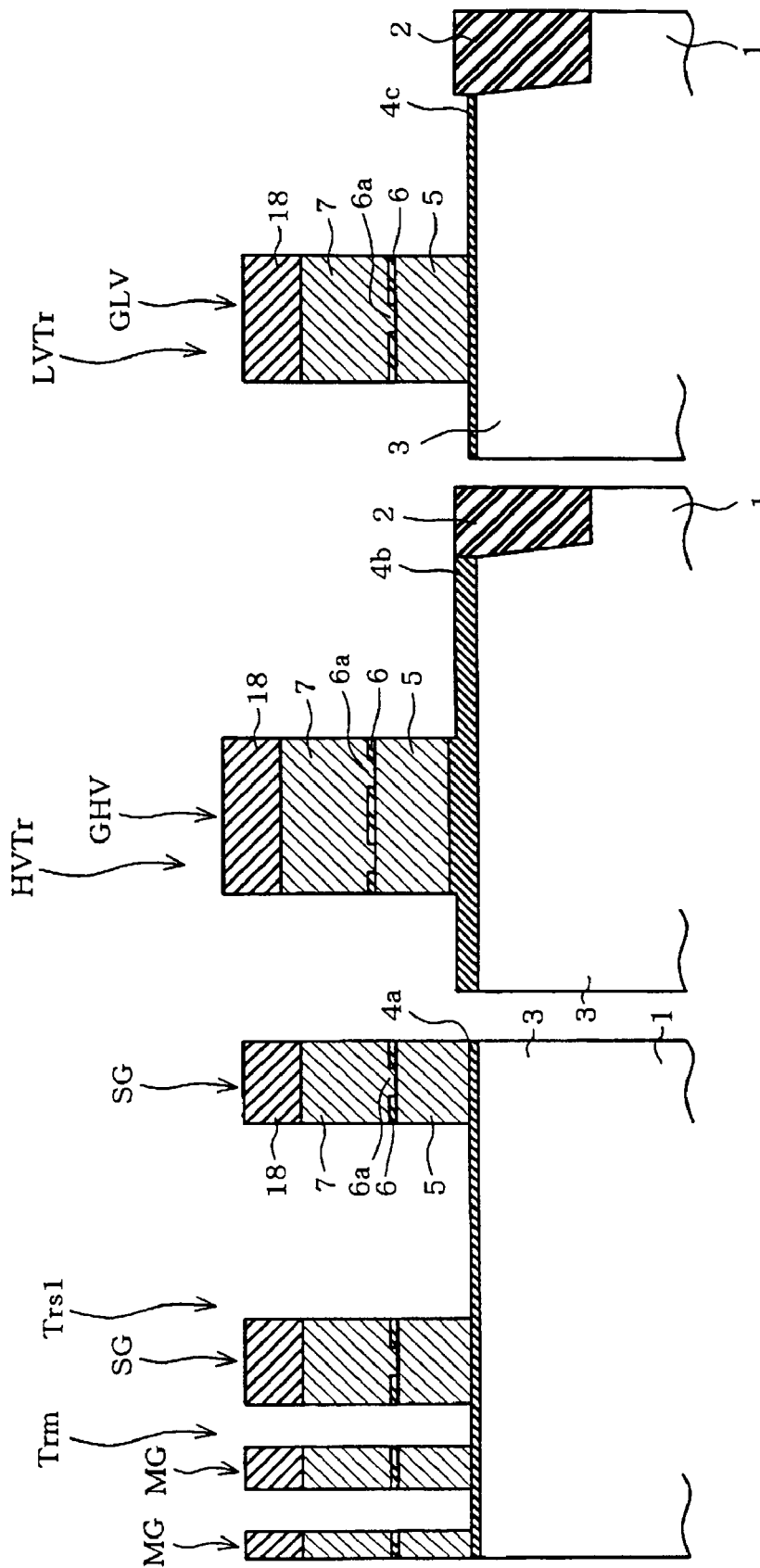

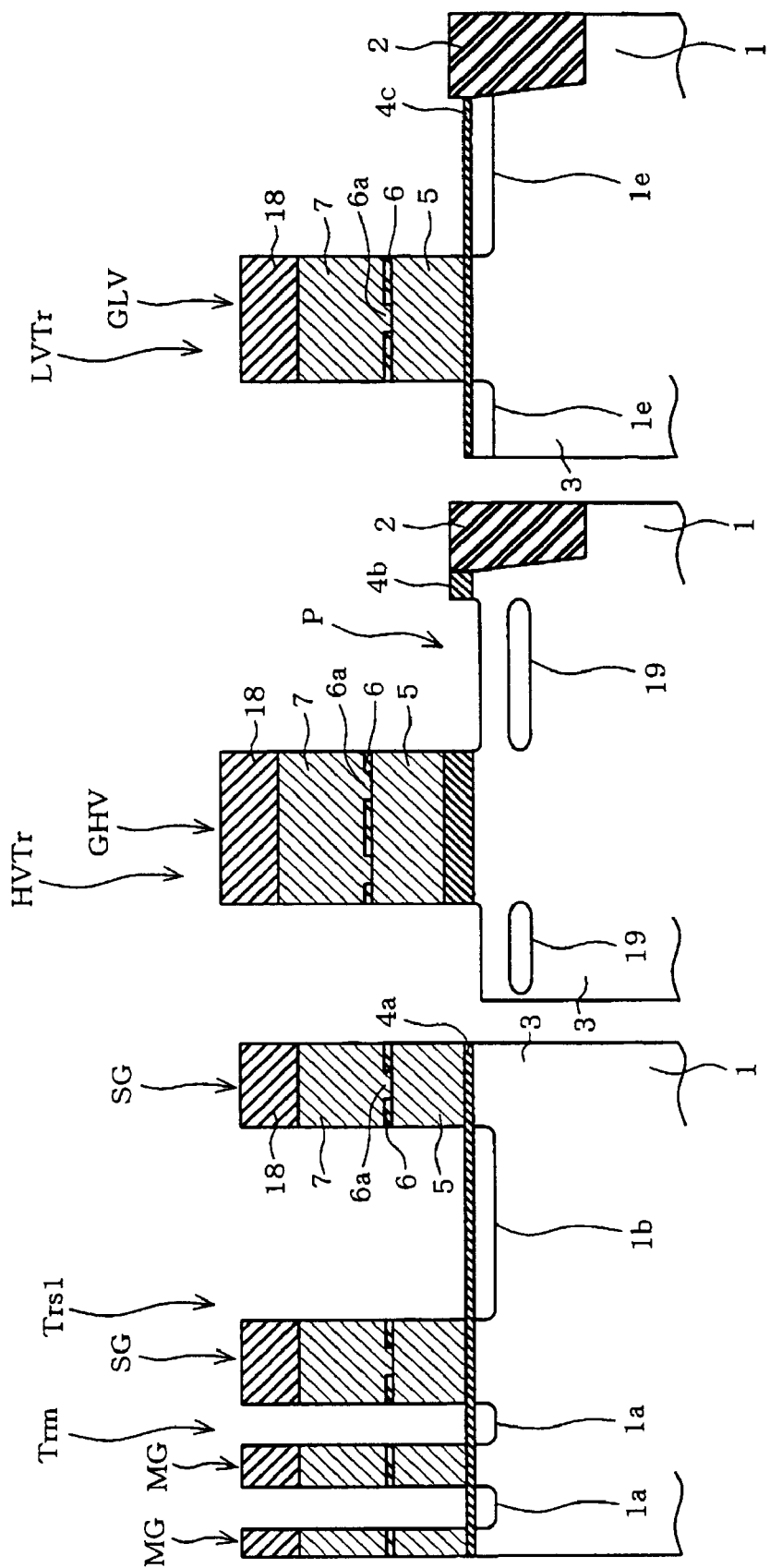

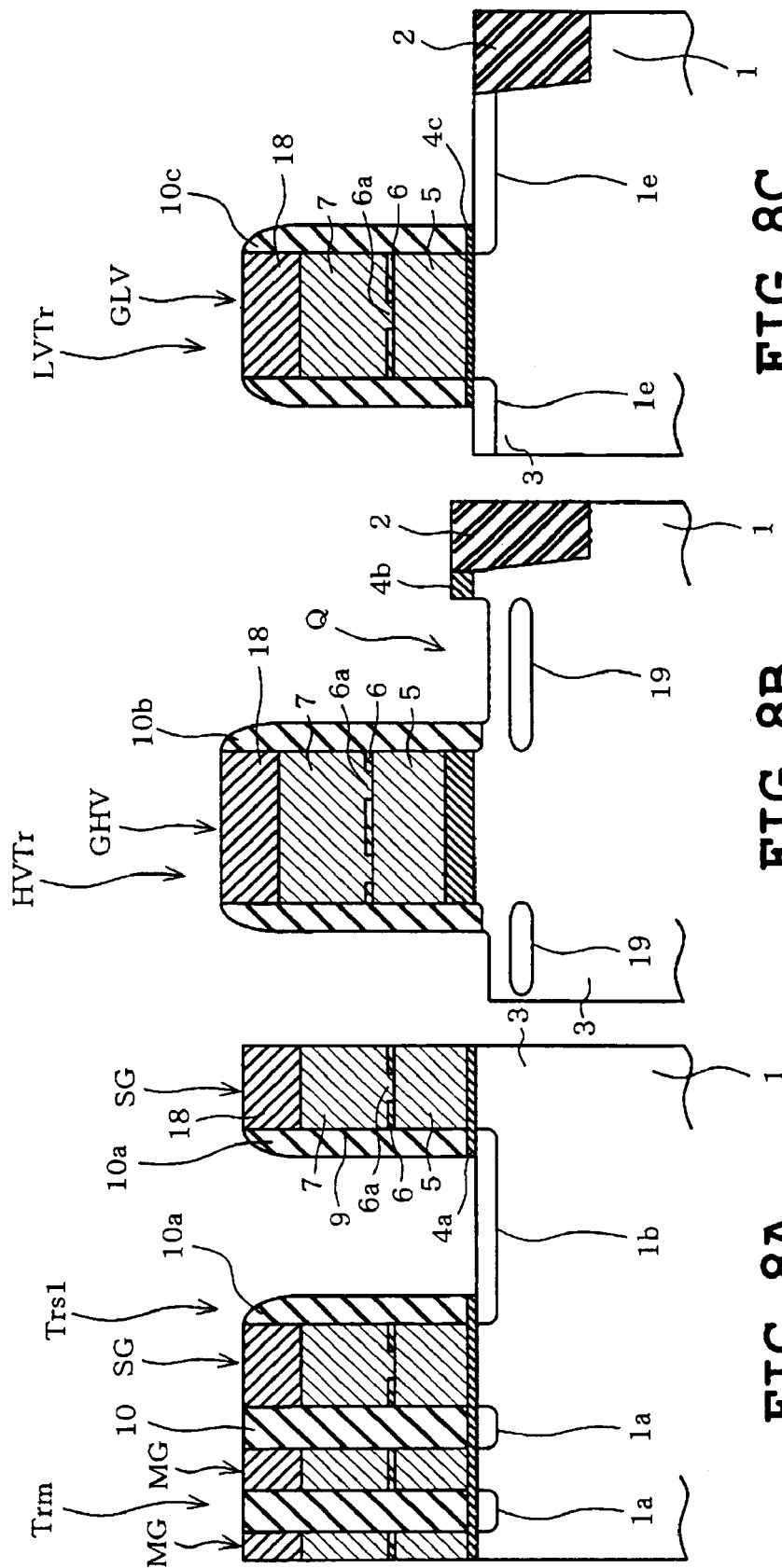

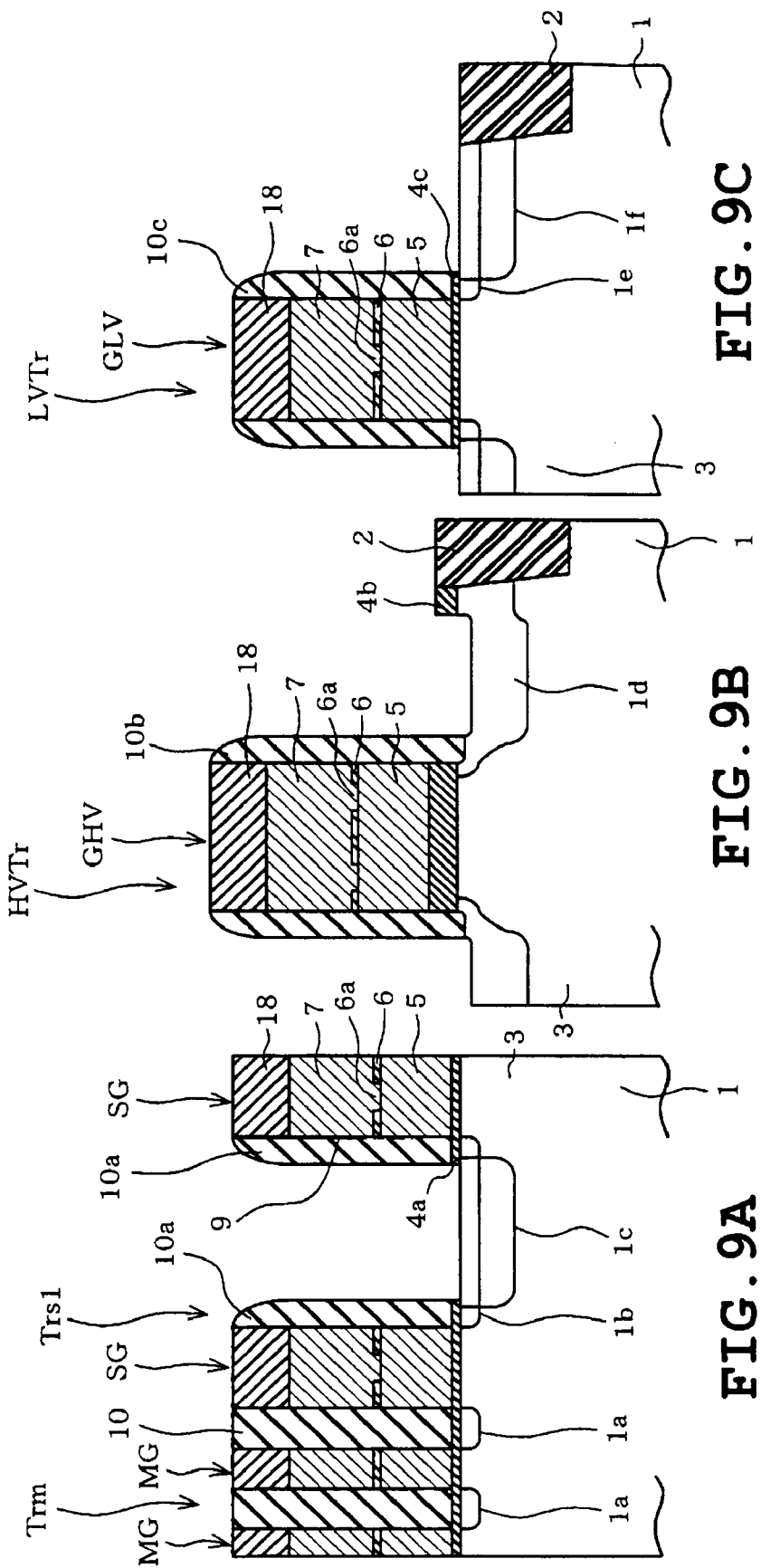

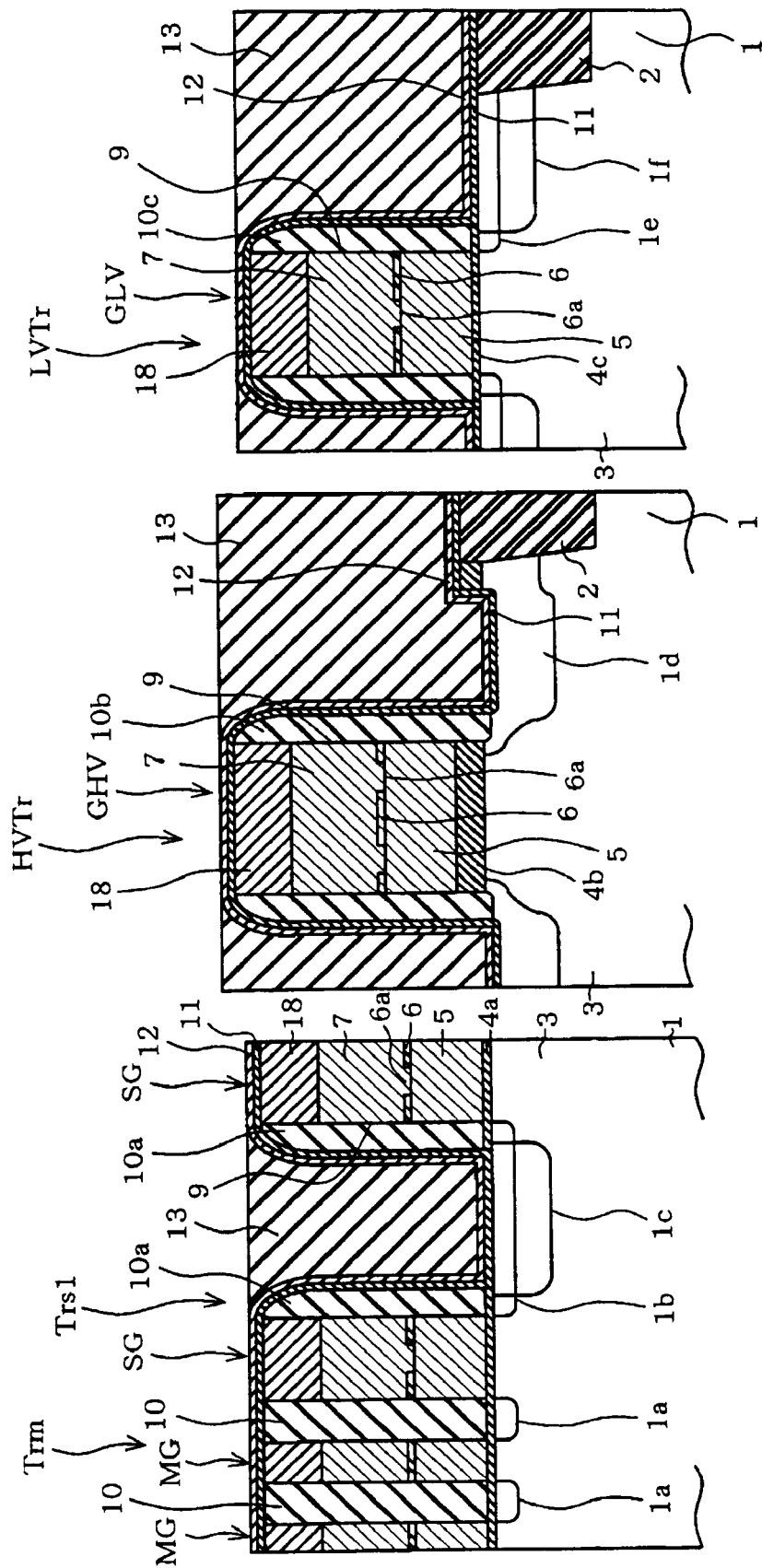

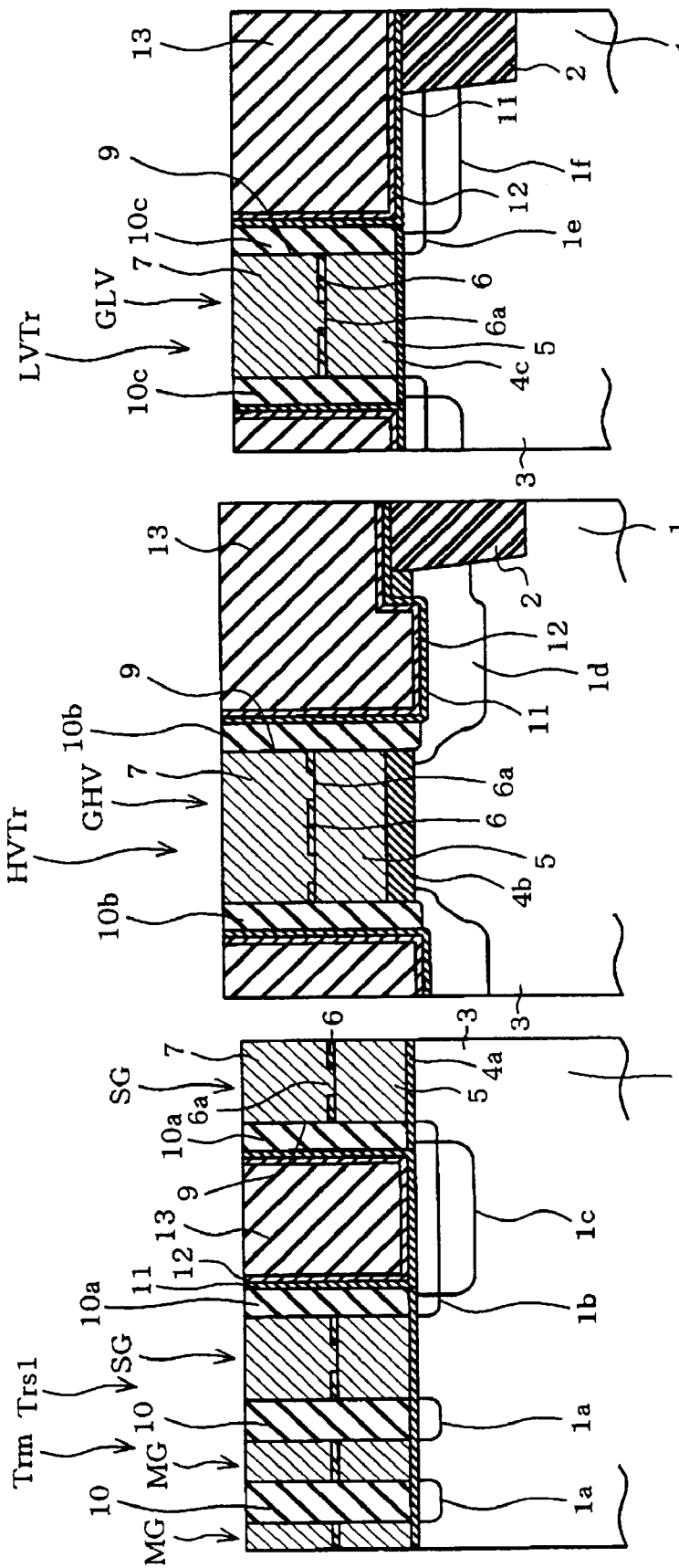

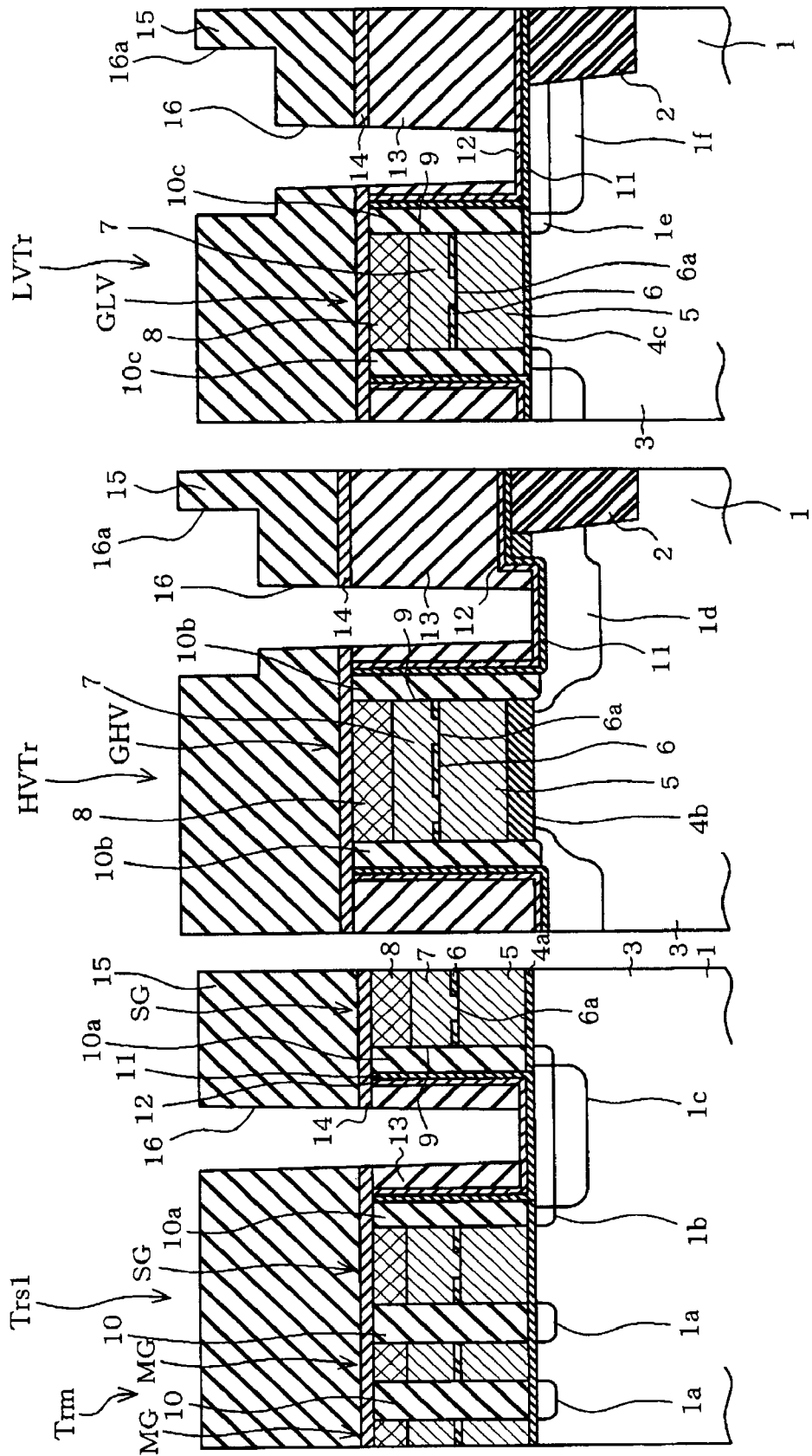

NONVOLATILE SEMICONDUCTOR MEMORY DEVICE AND METHOD OF FABRICATING THE SAME

CROSS-REFERENCE TO RELATED APPLICATIONS

This application is based on and claims the benefit of priority from the prior Japanese Patent Application No. 2006-281522, filed on Oct. 16, 2006, the entire contents of which are incorporated herein by reference.

BACKGROUND OF THE INVENTION

1. Field of the Invention

The present invention relates to a nonvolatile semiconductor memory device having high breakdown voltage transistors and a method of fabricating the same.

2. Description of the Related Art

A NAND flash memory which is one of nonvolatile semiconductor memory devices includes selective gate transistors and bit-line contacts adjacent to the selective gate transistors. Each bit-line contact has a barrier film for forming a contact hole or a silicon nitride film serving as a liner film either of which is formed on a spacer insulating film provided on a sidewall of the selective gate transistor. The silicon nitride film is also formed on a source/drain region in which a gate oxide film is formed on the surface of a silicon substrate. See JP-A-2006-60138, for example.

High breakdown voltage transistors are formed in a peripheral circuit region since high voltage needs to be applied to a memory cell transistor at the time of data writing and data erasing in the NAND flash memory. A gate insulating film of each high breakdown voltage transistor has a large film thickness than a gate insulating film of the memory cell transistor or selective gate transistor. See JP-A-H11-31799, for example.

Ion implantation to the source/drain region of the high breakdown voltage transistor is difficult when the thick gate insulating film remains on the silicon substrate in the source/drain region. Accordingly, the ion implantation is considered to be carried out after removal of the gate oxide film on the source/drain region. However, when the aforesaid sidewall insulating film and the silicon nitride film serving as the barrier film are formed in turn subsequent to the ion implantation, the silicon nitride film is formed directly on the surface of the silicon substrate. The direct formation of the silicon nitride film on the substrate surface stresses the silicon substrate, causing crystal fault or trap of the gate oxide film. As a result, the reliability of the high breakdown voltage is reduced.

BRIEF SUMMARY OF THE INVENTION

Therefore, an object of the present invention is to provide a nonvolatile semiconductor memory device which can prevent a reduction in the reliability of the high breakdown voltage transistors and a method of fabricating the same.

In one aspect, the present invention provides a nonvolatile semiconductor memory device comprising a semiconductor substrate having an upper surface and a surface layer, a gate insulating film formed on the upper surface of the semiconductor substrate, a gate electrode formed on the gate insulating film and having a sidewall, a source/drain region formed at each side of the gate electrode on the surface layer of the semiconductor substrate respectively, the source/drain region including a first region, a second region and a third region located between the first and second regions, a contact plug formed on the second region of the source/drain region, a first silicon oxide film formed on the sidewall of the gate electrode so as to serve as an ion implantation spacer, the first silicon oxide film having a first lower surface in contact with the upper surface of the first region of the source/drain region and located lower than the upper surface of the semiconductor substrate where the gate insulating film is located, a second silicon oxide film formed on the third region of the source/drain region and a side surface of the first silicon oxide film, the second silicon oxide film having a second lower surface in contact with the upper surface of the source/drain region and located lower than the first lower surface of the first silicon oxide film, and a silicon nitride film formed on an upper surface of the second silicon oxide film, wherein the first silicon oxide film, the second oxide film having the silicon nitride film formed thereon, and the contact plug are contiguously arranged on said first, third and second regions of the source/drain region, and the contact plug extends through the second silicon oxide film and the second nitride film to contact the source/drain region.

In another aspect, the invention provides a method of fabricating a nonvolatile semiconductor memory device, comprising preparing a semiconductor substrate having a surface layer and a first upper surface and forming a gate insulating film on the first upper surface of the semiconductor substrate, the gate insulating film having a second upper surface, forming a gate electrode on the second upper surface, the gate electrode having a third upper surface, removing the gate insulating film located at both sides of the gate electrodes on the first upper surface, forming a source/drain regions in the surface layer of the semiconductor substrate located at each side of the gate electrode from which the gate insulating film has been removed, respectively, the source/drain region having an upper surface, forming a first silicon oxide film on the third and fourth upper surfaces, etching the first silicon oxide film thereby to be formed into an ion implantation spacer on the sidewall of the gate electrode, the spacer having a surface, forming a second silicon oxide film on the upper surface of the source/drain region and the surface of the spacer, the second silicon film having a third upper surface, and forming a silicon nitride film on the third upper surface.

BRIEF DESCRIPTION OF THE DRAWINGS

Other objects, features and advantages of the present invention will become clear upon reviewing the following description of one embodiment with reference to the accompanying drawings, in which:

FIGS. 6A, 6B and 6C are schematic longitudinally sectional views of the memory cell region in one of the sequential steps of the fabricating process (No. 3);

FIGS. 7A, 7B and 7C are schematic longitudinally sectional views of the memory cell region in one of the sequential steps of the fabricating process (No. 4);

FIGS. 8A, 8B and 8C are schematic longitudinally sectional views of the memory cell region in one of the sequential steps of the fabricating process (No. 5);

FIGS. 9A, 9B and 9C are schematic longitudinally sectional views of the memory cell region in one of the sequential steps of the fabricating process (No. 6);

FIGS. 11A, 11B and 11C are schematic longitudinally sectional views of the memory cell region in one of the sequential steps of the fabricating process (No. 8);

FIGS. 12A, 12B and 12C are schematic longitudinally sectional views of the memory cell region in one of the sequential steps of the fabricating process (No. 9);

FIGS. 14A, 14B and 14C are schematic longitudinally sectional views of the memory cell region in one of the sequential steps of the fabricating process (No. 11).

DETAILED DESCRIPTION OF THE INVENTION

One embodiment of the present invention will be described with reference to the accompanying drawings. The intention is applied to a NAND flash memory in the embodiment. Identical or similar parts are labeled by the same reference symbols throughout the figures. It is noted that the figures illustrate frame formats of the device and the relationship between a thickness and planar dimension, thickness ratio of each layer and the like differ from those of actually fabricated devices.

Figure 1:
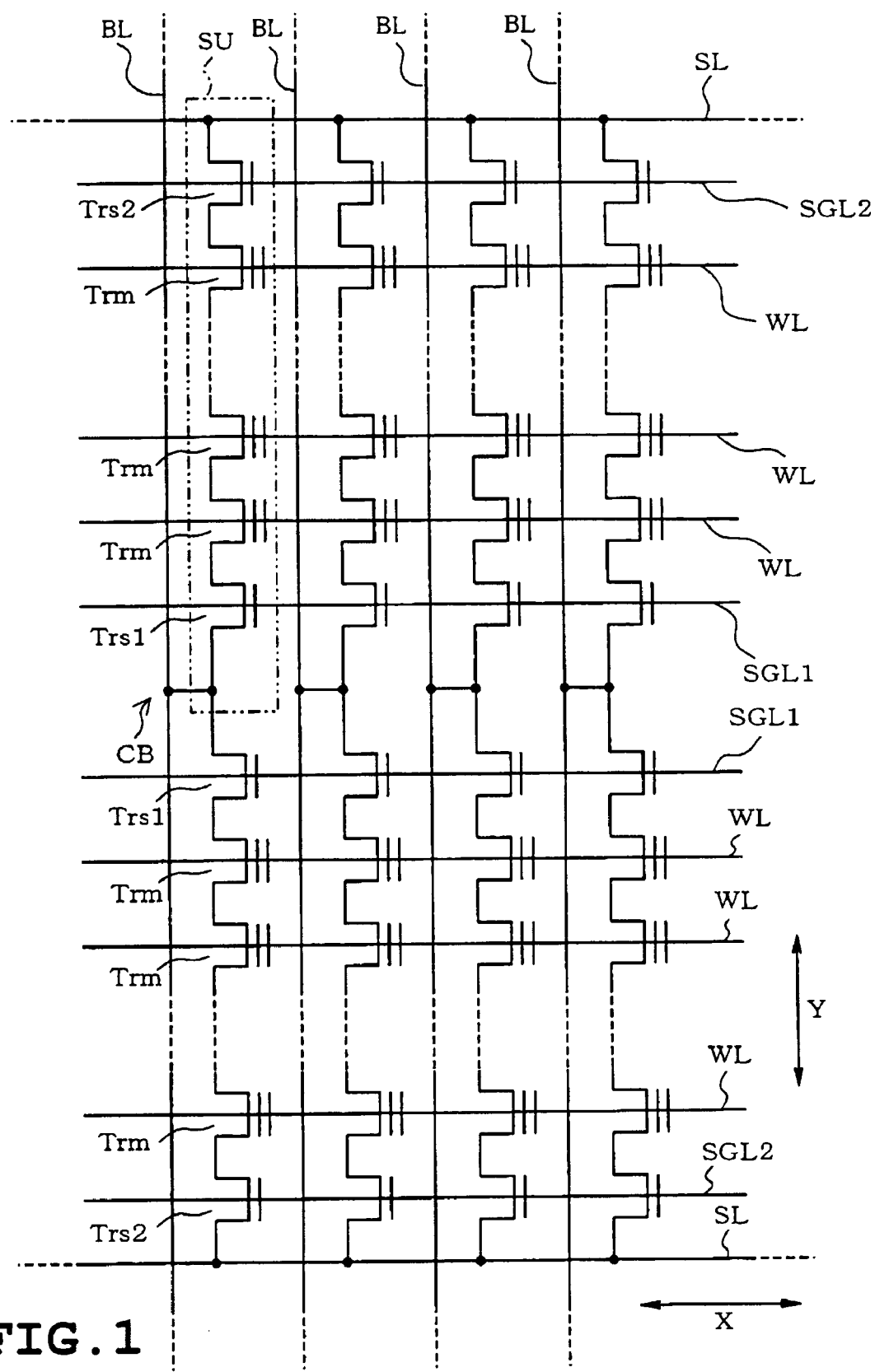
FIG. 1 is an equivalent circuit diagram showing a part of memory cell array of a NAND flash memory in accordance with one embodiment of the present invention.

FIG. 1 is a circuit schematic equivalent to a part of memory cell array composed in a memory cell region of the NAND flash memory. A memory cell array of the NAND flash memory comprises NAND cell units SU each of which comprises two selective gate transistors Trs and a plurality of memory cell transistors Trm ($2^n$ where n is a positive number, for example, 8) series connected between the selective gate transistors Trs. In each NAND cell unit SU, memory cell transistors Trm adjacent to each other have a common source/drain region.

The memory cell transistors Trm arranged in the X direction (corresponding to a word line direction and gate width direction) are connected in common to a word line WL (control gate line). Furthermore, the selective gate transistors Trs1 arranged in the X direction in FIG. 1 are connected in common to a selective gate line SGL1. The selective gate transistors Trs2 are connected in common to a selective gate line SGL2. A bit line contact CB is connected to a drain region of the selective gate transistor Trs1. The bit line contact CB is connected to a bit line BL extending in the Y direction (corresponding to the direction of gate length and bit line direction) perpendicular to the X direction in FIG. 1. The selective gate transistor Trs2 is connected via a source region to a source line SL extending in the X direction in FIG. 1.

Figure 2:
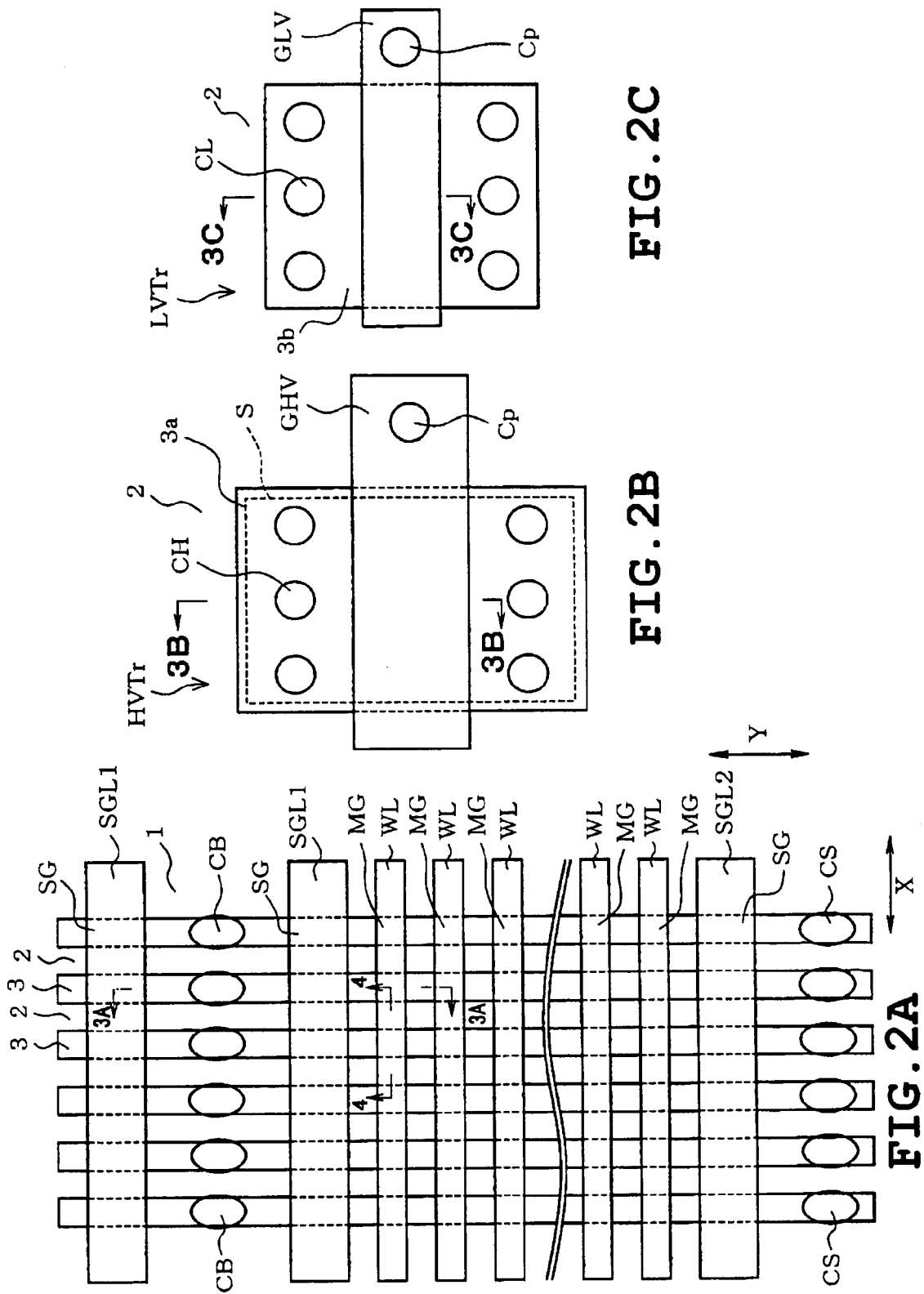
FIGS. 2A, 2B and 2C are plan views showing a frame format of a part of the memory cell region, a lower breakdown voltage transistor and a higher breakdown voltage transistor respectively.

FIG. 2A shows a layout pattern of a part of memory cell region. FIG. 2B shows a layout pattern of a higher breakdown voltage transistor region of a peripheral circuit region. FIG. 2C shows a layout pattern of a lower breakdown voltage transistor region of the peripheral circuit region. A plurality of shallow trench isolation (STI) structures 2 serving as element isolation regions is formed at predetermined intervals so as to extend in the Y direction in FIG. 2, whereby a plurality of active areas 3 is separately formed so as to extend in the X direction in FIG. 2. Word lines WL of the memory cell transistors are formed at predetermined intervals so as to extend in the X direction perpendicular to the Y direction in FIG. 2. A pair of selective gate lines SGL1 of a selective gate transistor are formed so as to extend in the X direction in FIG. 2. The active areas 3 located between the paired selective gate lines SGL1 are formed with bit line contacts CB respectively. Parts of the active areas 3 intersecting with the word lines WL are formed with gate electrodes G respectively. Parts of the active areas 3 intersecting with the selective gate lines SGL1 are formed with gate electrodes SG of the selective gate transistors respectively.

Referring further to FIGS. 2B and 2C, the higher and lower breakdown voltage transistors HVTr and LVTr formed in peripheral circuit region are provided in respective portions of the silicon substrate 1 where the STI structures 2 are formed so that rectangular active areas 3a and 3b remain. Gate electrodes GHV and GLV are formed so as to extend across the higher and lower breakdown voltage transistors HVTr and LVTr respectively. Source/drain regions are formed at both sides of each of the gate electrodes GHV and GLV by diffusing impurities. The source/drain regions and the gate electrodes GHV and GLV are formed with respective contact plugs CH, CL and Cp.

Figure 3:
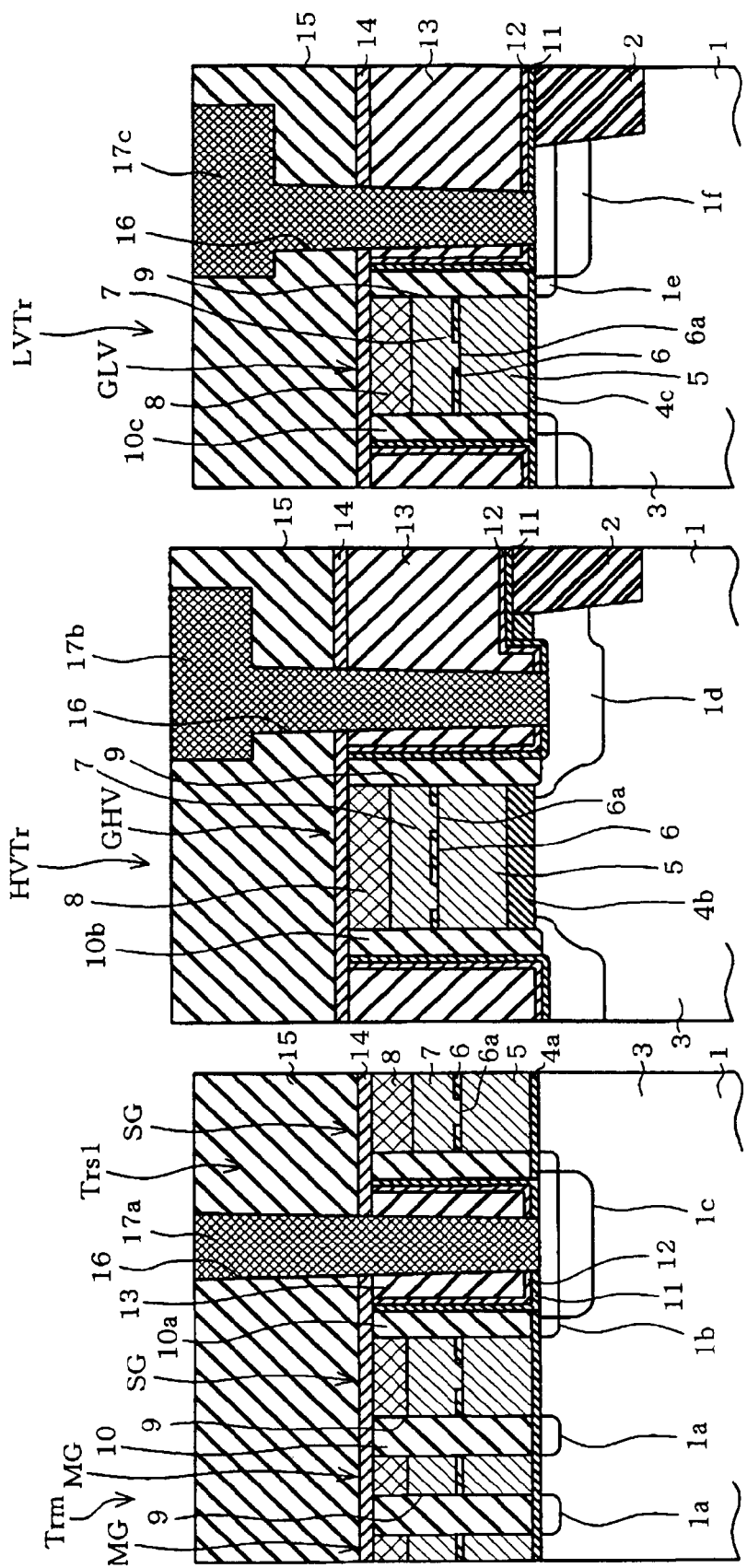
FIGS. 3A, 3B and 3C are sectional views taken along lines 3A-3A, 3B-3B and 3C-3C in FIG. 2 respectively.

FIGS. 3A, 3B and 3C are sectional views taken along lines 3A-3A, 3B-3B and 3C-3C in FIG. 2 respectively. More specifically, FIGS. 3A, 3B and 3C show a memory cell region with a gate electrode SG of a selective gate transistor in the active area 3, a higher breakdown voltage transistor region and a lower breakdown voltage transistor region respectively. In FIG. 3A, a tunnel insulating film 4a having a film thickness of about 8 nm is formed on the silicon substrate 1. The tunnel insulating film 4a serves as a gate insulating film. Gate electrodes MG and SG of the memory cell transistor and selective gate transistor are formed on the tunnel insulating film 4a. Each of the gate electrodes MG and SG is formed by sequentially depositing a polycrystalline silicon film 5 for a floating gate electrode, an inter-electrode insulating film comprising an oxide-nitride-oxide (ONO) film, a polycrystalline silicon film 7 for a control gate electrode and a cobalt silicide ($CoSi_2$) film serving as a metal silicide layer.

The intergate insulating film 6 of the gate electrode SG is formed with an opening 6a through which the polycrystalline silicon films 5 and 7 electrically conduct. The polycrystalline silicon film 7 is buried in the opening 6a. Two impurity diffusion layers 1a are formed in a surface layer (or surface) of the silicon substrate 1 so as to be located between the gate electrodes MG and between the gate electrodes MG and SG respectively. Each impurity diffusion layer 1a serves as a source/drain region. An impurity diffusion region 1b and a higher density impurity diffusion region 1c are also formed in the surface layer of the silicon substrate 1 so as to be located between the gate electrodes SG. The higher density impurity diffusion region 1c constitutes a lightly doped drain (LDD).

Each gate electrode MG and the gate electrode SG have respective sidewalls on which silicon oxide films 9 are formed by a rapid thermal processor (RTP) method. Silicon oxide films 10 are formed between the silicon oxide films 9 of the gate electrodes MG and SG and between the silicon oxide films 9 of the gate electrodes MG by a low pressure chemical vapor deposition (LPCVD) method. The silicon oxide films 10 serve as first silicon oxide films. Furthermore, a spacer 10a is formed on the sidewall of the gate electrode SG opposed to the other gate electrode SG by processing the silicon oxide film 10. The silicon oxide film 10 and the spacer 10a are formed on the tunnel insulating film 4a formed on the silicon substrate 11.

A silicon oxide film 11 such as tetraethyl orthosilicate (TEOS) film is formed on a side of the spacer 10a and the surface of the silicon substrate 1. The silicon oxide film 11 serves as a second silicon oxide film and has a film thickness ranging from 10 to 20 nm, for example, 10 nm. A silicon nitride film 12 serving as a first barrier insulating film is formed on the surface of the silicon oxide film 11. The silicon nitride film 12 has a film thickness of about 20 nm. In this case, the aforesaid silicon oxide film 11 serves as the base for the silicon nitride film 12, whereupon the silicon nitride film 12 can be avoided directly contacting the surface of the silicon substrate 1. A further another silicon oxide film 13 such as boro phosphor silicate glass (BPSG) is formed on the silicon nitride film 12 located between the gate electrodes SG so as to be buried between the gate electrodes SG. The silicon oxide film 13 serves as a third silicon oxide film.

A silicon nitride film 14 is formed on the upper surfaces of the gate electrodes MG, the upper surface of the silicon oxide film 10 located between the gate electrodes MG and between the gate electrodes MG and SG and the upper surfaces of the spacer 10a and silicon oxide film 13, so as to cover the aforesaid upper surfaces. The silicon nitride film 14 is formed so that the upper surface thereof is located higher than the upper surface of the cobalt silicide film 8 relative to the silicon substrate 1. A TEOS film 15 serving as a fourth silicon oxide film is formed on the silicon nitride film 14 and planarized.

A contact hole 16 is formed in the forming region of the silicon oxide film 13 between the gate electrodes SG. The contact hole 16 extends from an upper surface of the TEOS film 15 to the upper surface of the silicon substrate 1. The contact hole 16 is formed through the TEOS film 15, silicon nitride film 14, silicon oxide film 13, silicon nitride film 12 and silicon oxide film 11 such that the upper surface of the silicon substrate 1 is exposed. A contact plug 17a is formed by burying an electrical conductor in the contact hole 16 and electrically connected to the silicon substrate 1. In FIG. 3A, the contact plug 17a constitutes the bit line contact CB in FIG. 2.

In FIG. 3B, the higher breakdown voltage transistor HVTr is configured as follows. A gate oxide film 4b having a larger film thickness than the tunnel insulating film 4a, for example, about 35 nm, is formed on the silicon substrate 1. On the gate oxide film 7 are sequentially deposited the polycrystalline silicon film 5, inter-electrode insulating film 6 comprising an oxide-nitride-oxide (ONO) film, polycrystalline silicon film 7 and cobalt silicide (CoSi$_2$) film, whereby the gate electrode GHV is constituted. The intergate insulating film 6 of the gate electrode GHV is formed with an opening 6a through which the polycrystalline silicon films 5 and 7 electrically conduct. The polycrystalline silicon film 7 is also buried in the opening 6a. Impurity diffusion layers 1d of the LDD structure are formed at both sides of the gate electrode GHV in the semiconductor substrate 1. Each impurity diffusion layer 1d serves as the source/drain region.

A silicon oxide film 9 is formed on the sidewall of the gate electrode GHV by the RTP method. The spacer 10b is formed outside the silicon oxide film 9 by processing the silicon oxide film 10. The spacer 10b has a lower surface which is formed directly on the silicon substrate 1 so as to be in contact with the silicon substrate 1. A silicon oxide film 11 such as a TEOS film is formed on the surface of the spacer 10b of the gate electrode GHV and the surface of the source/drain region 1d of the silicon substrate 1. The silicon oxide film 11 has a film thickness ranging from 10 to 20 nm, for example, 10 nm. The silicon oxide film 11 is formed so that the lower surface thereof on the source/drain region 1d is located lower than the lower surface of the spacer 10b. A silicon nitride film 12 serving as a barrier insulating film is formed on the surface of the silicon oxide film 11. The silicon nitride film 12 has a film thickness of about 20 nm. The silicon oxide film 11 prevents the silicon nitride film 12 from direct contact with the surface of the silicon substrate 1 in the same manner as described above. Furthermore, a silicon oxide film 13 such as a BPSG film is formed on the silicon nitride film 12 so as to be located lower than the upper surface of the gate electrode GHV.

The silicon nitride film 14 serving as a second barrier insulating film is formed so as to cover an upper surface of the above-described formation. The TEOS film 15 is formed on the silicon nitride film 14 and planarized. A contact hole 16 is formed in the forming region of the silicon oxide film 13 in the source/drain region 1d. The contact hole 16 extends from an upper surface of the TEOS film 15 to the upper surface of the silicon substrate 1. The contact hole 16 is formed through the TEOS film 15, silicon nitride film 14, silicon oxide film 13, silicon nitride film 12 and silicon oxide film 11 such that the upper surface of the silicon substrate 1 is exposed. A contact plug 17b is formed by burying an electrical conductor in the contact hole 16 and electrically connected to the silicon substrate 1. In FIG. 3B, the contact plug 17b constitutes the contact plug CH in FIG. 2.

The height of the silicon substrate 1 differs in the surface of the source/drain region 1d of the higher breakdown voltage transistor HVTr. More specifically, a substrate 1 surface part on which the spacer 10b is formed is slightly lower than a substrate 1 surface part on which the gate oxide film 4b is formed. Furthermore, a substrate 1 surface part with which the silicon oxide film 11 is in contact is lower than the substrate 1 surface part on which the spacer 10b is formed. As will be described in the fabrication process, these surface differences are referred to as "silicon gouging" which occurs in processing steps. Accordingly, the spacer 10b is formed so that the lower surface thereof is located lower than the surface 1 part on which the gate oxide film 4b is formed. Furthermore, the silicon oxide film 11 is formed so that the lower surface thereof is located lower than the lower surface of the spacer 10b in the source/drain region on the source/drain region 1d.

In FIG. 3C, the lower breakdown voltage transistor LVTr of the peripheral circuit region is also configured substantially in the same manner as described above regarding the higher breakdown voltage transistor HVTr. The lower breakdown voltage transistor LVTr includes a gate oxide film 4c which has a film thickness equal to or approximate to the film thickness of the tunnel oxide film 4a of the memory cell transistor Trm. A spacer 10c is formed on the gate oxide film 4c and the sidewall of the gate electrode GLV of the lower breakdown voltage transistor LVTr by processing the silicon oxide film 10. A source/drain region 1e and an impurity diffusion region 1f forming the LDD structure are further provided. Additionally, a contact plug 17c constitutes the contact plug CL in FIG. 2C.

As obvious from the foregoing, the silicon oxide film 11 is formed as the base for the silicon nitride film 12 in the embodiment. Consequently, the reliability of the higher breakdown voltage transistor HVTr can be improved as compared with the configuration that the silicon nitride film 12 is in direct contact with the silicon substrate 1. More specifically, when considering the case where the silicon nitride film 11 serving as the barrier film for the higher breakdown voltage transistor HVTr, it is assumed that hot carrier produced in the vicinity of drain would be trapped in the silicon nitride film 11 upon application of high field stress to the drain side.

When electron is trapped in the silicon nitride film 11 on the source/drain region 1d, fixed charge is produced in the silicon nitride film 11 and acts so as to impede the flow of electricity flowing in the source/drain region 1d. As a result, an amount of on-current of the higher breakdown voltage transistor HVTr is deemed to be decreased and accordingly, the reliability of the transistor is reduced. However, the foregoing embodiment can prevent the aforesaid defect and improve the reliability of the transistor.

Furthermore, the NAND flash memory of the embodiment is configured so that the silicon nitride film 11 serving as the first barrier insulating film is prevented from penetrating between the gate electrodes MG or the gate electrodes MG and SG. Consequently, the NAND flash memory can be configured without an increase in the coupling capacitance between the cell transistors.

The first barrier insulating film 11 serves as a barrier against diffusion of the substance such as ion or moisture content in the first or second silicon oxide film 12 or 15 and reaction of the substance in the insulating layer 12 or 15 upon the cobalt silicide film 8. In addition, the barrier films 11 and 13 also serve as stoppers in the forming of the contact holes 16.

As described above, the memory cell transistors Trm are adjacent to each other in bit-line direction and accordingly share the impurity diffusion layer 1a serving as the source/drain. Furthermore, each memory cell transistor Trm is provided so that a current path is series-connected between the selective gate transistors Trs and is selected by the selective transistor Trs. The selective gate transistor Trs to be connected to the current path of the memory cell transistor Trm is not shown in the figures. Furthermore, the number of memory cell transistors Trm series-connected between the selective transistors Trs may be a plural number, for example, 8, 16, 32 or the like and should not be limited.

Figure 4:
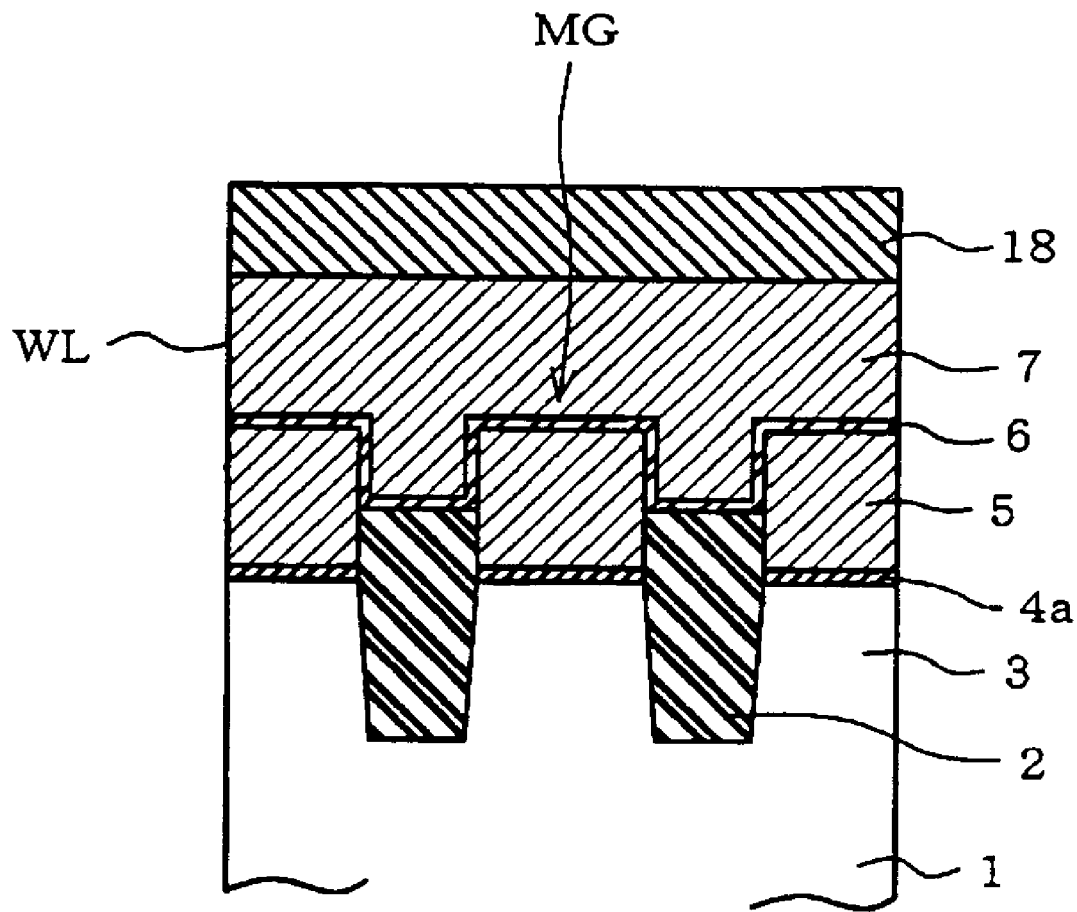
FIG. 4 is a schematic longitudinally sectional view of the memory cell region in one of sequential steps of the fabricating process (No. 1)
Figure 5B:
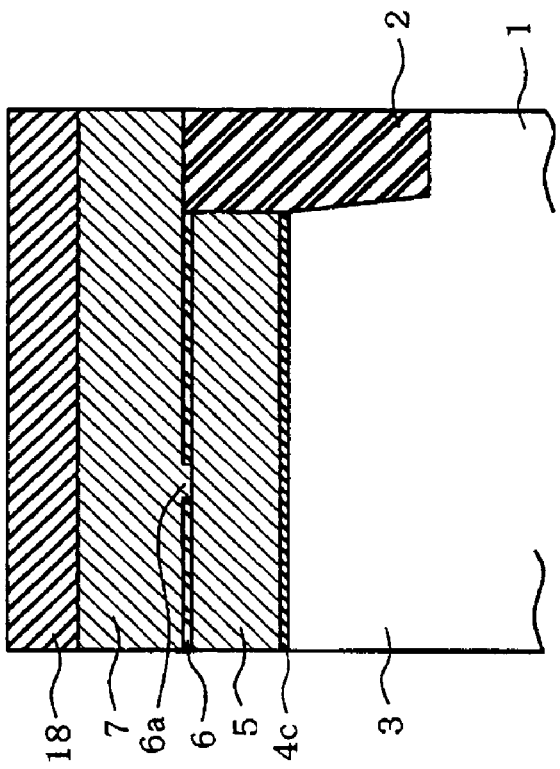
FIGS. 5A and 5B are schematic longitudinally sectional views of the memory cell region in one of the sequential steps of the fabricating process (No. 2)
Figure 5A:
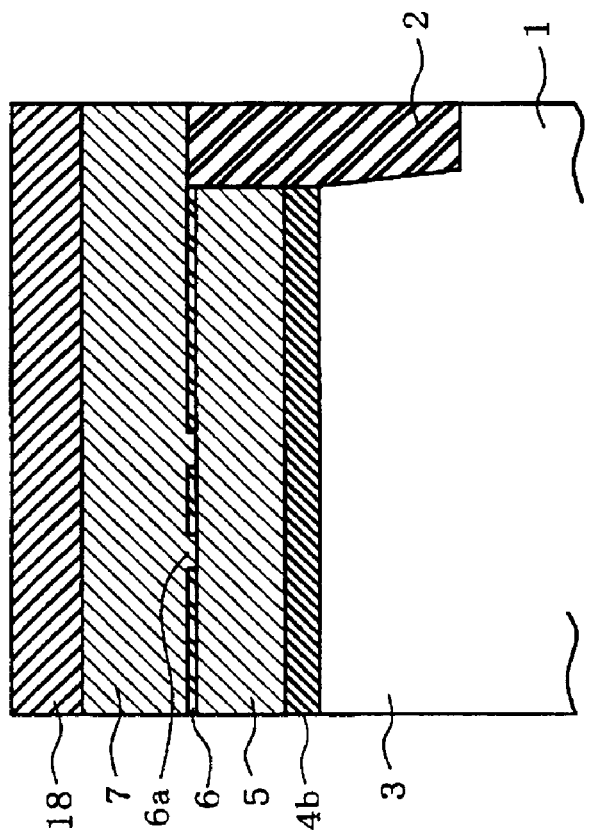

The fabricating process will now be described with reference to FIGS. 3A to 14C. A stacked structure of the gate electrodes MG, SG, GHV and GLV is formed as shown in FIGS. 4, 5A and 5B.

Firstly, ion implantation to the silicon substrate 1 is carried out for the forming of a well and channel regions, and thereafter, the gate oxide film 4b for the higher breakdown voltage transistor HVTr is formed so as to have a film thickness of about 35 nm. Subsequently, the gate oxide film 4b is removed selectively from the memory cell region and the forming regions of the lower breakdown voltage transistors LVTr. Thereafter, the tunnel oxide film 4a is formed so as to have a film thickness of about 8 nm. Thus, the gate oxide films with different film thicknesses are formed.

Subsequently, the polycrystalline silicon film 5 serving as the floating gate electrode is deposited about 100 nm. Thereafter, the trenches serving as the element isolation regions are formed by the known lithography method and RIE method with a silicon nitride film used as a mask material. Each trench is filled with the silicon oxide film so that the STI structure 2 is formed. Subsequently, the silicon oxide film in the STI structure 2 in the memory cell region as shown in FIG. 4 is etched back for the purpose of adjusting a coupling ratio of the memory cell transistor Trm. Thereafter, the ONO film is formed as the intergate insulating film 6. Before or after the forming of the ONO film, a NONON (nitride-oxide-nitride-oxide-nitride) film may be formed using a nitriding technique.

Subsequently, the polycrystalline silicon film 7 with a film thickness of about 160 nm is formed as the control gate electrode. Thereafter, a silicon nitride film 18 is formed as a mask material to be used in the forming of the gate electrode.

In this case, the polycrystalline silicon films 7 and 5 of the control gate electrode and floating gate electrode need to be brought into electrical contact with each other in the transistors HVTr and LVTr of the peripheral circuit and the selective gate transistor Trs. Accordingly, as shown in FIGS. 5A and 5B, the opening 6a is formed in the intergate insulating film 6 before the forming of the polycrystalline silicon film 7.

Subsequently, as shown in FIGS. 6A to 6C, patterning is carried out for the gate electrodes MG, SG, HVG and LVG by the photolithography method and the RIE method. Firstly, the silicon nitride film 18 and the polycrystalline silicon film 7 are etched in turn. Next, when the intergate insulating film 6 is to be etched, overetching is carried out so that etching reaches the STI structure 2 shown in FIG. 4. As a result, the intergate insulating film 6 formed on the floating gate sidewall is removed and simultaneously, the STI structure 2 protruding to the upper surface of the polycrystalline silicon film 5 in the peripheral circuit region is etched so that an upper surface thereof is located in the vicinity of the gate oxide films 4b and 4c.

Subsequently, the polycrystalline silicon film 5 serving as the floating gate electrode is selectively etched. In this case, when the polycrystalline silicon film 5 is processed with the STI structure 2 protruding from the silicon substrate 1, the polycrystalline silicon film 5 tends to remain at an edge of the STI structure 2, resulting in a short circuit. For this reason, the STI structure 2 is previously etched as described above.

Subsequently, as shown in FIGS. 7A to 7C, the thick gate oxide film 4b of the higher breakdown voltage transistor HVTr located on the semiconductor substrate 1 is etched after the forming of the gate electrode, thereby being removed. The gate oxide film 4b has a film thickness of about 35 nm. In this case, as shown by broken line S in FIG. 2B, an opening is formed into such a pattern that only the higher breakdown voltage transistor region is slightly narrowed, and the gate oxide film 4b is etched by the RIE method.

In the etching process, the gate oxide film 4b is overetched in view of process variation so as to be reliably removed. As the result of the overetching, although selectively etched by the RIE method, the silicon substrate 1 is more or less gouged as shown by arrow P in FIG. 7B. The source/drain region 1d at the side of the gate electrode GHV of the higher breakdown voltage transistor HVTr usually has gouging. Furthermore, the surface of the STI structure 2 is protected in the higher breakdown voltage transistor region during the above-described etching process, and a slight amount of the silicon oxide film 4b remains at the silicon substrate 1 side.

Subsequently, post oxidation is carried out by the RTP method or the like so that the silicon oxide films 9 are formed on the sidewalls of the gate electrodes MG, SG, GHV and LGV. Thereafter, ion implantation is carried out for formation of impurity diffusion regions which serve as the source/drain regions 1a, 1b and 1e. The lower breakdown voltage transistor LVTr section has the LDD structure, and for example, arsenic (As) ion is implanted with acceleration energy of 20 keV under the condition of $3.0 \times 10^{13}$ atoms/cm$^2$ so that the n-type source/drain region 1e is formed. In this case, the n-type source/drain regions 1a and 1b of the cell array section may be formed simultaneously or separately. Furthermore, the n-type source/drain region 1d needs to be formed with respect to the higher breakdown voltage transistor HVTr in the same manner. Higher breakdown voltage needs to be ensured since higher voltage is applied to the transistor HVTr. Accordingly, phosphorus (P) ion is implanted deep from the surface of the silicon substrate 1 with acceleration energy 30 keV under the condition of $5.0 \times 10^2$ atoms/cm$^2$, so that an impurity implantation region 19 is formed.

Subsequently, as shown in FIGS. 8A to 8C, the silicon oxide film 10 with a film thickness of about 50 nm, such as a TEOS film, is formed for the purposes of burying between the gate electrodes MG, forming sidewalls of the gate electrode SG and spacers on the sidewalls of the gate electrodes GHV and GLV of each transistor in the peripheral circuit region. The silicon oxide film 10 serves as a first silicon oxide film. The film thickness of the silicon oxide film 10 is determined so as to be sufficient for burying between the gate electrodes MG.

Subsequently, the silicon oxide film 10 is etched back so that the spacers 10a, 10b and 10c are formed on the sidewalls of the gate electrodes SG, GHV and GLV respectively. In this case, overetching is carried out in view of process variation. Accordingly, the surfaces of the silicon substrate 1 at both sides of the gate electrode HGTr of the transistor HVTr are gouged as shown by arrow Q in FIG. 8B in the same manner as in the removal of the gate oxide film 4 although the silicon substrate 1 is selectively etched by the RIE method. As a result, the surface of the silicon substrate 1 formed into the source/drain region 1d is gouged at two stages.

Figures 10A, 10B, 10C:
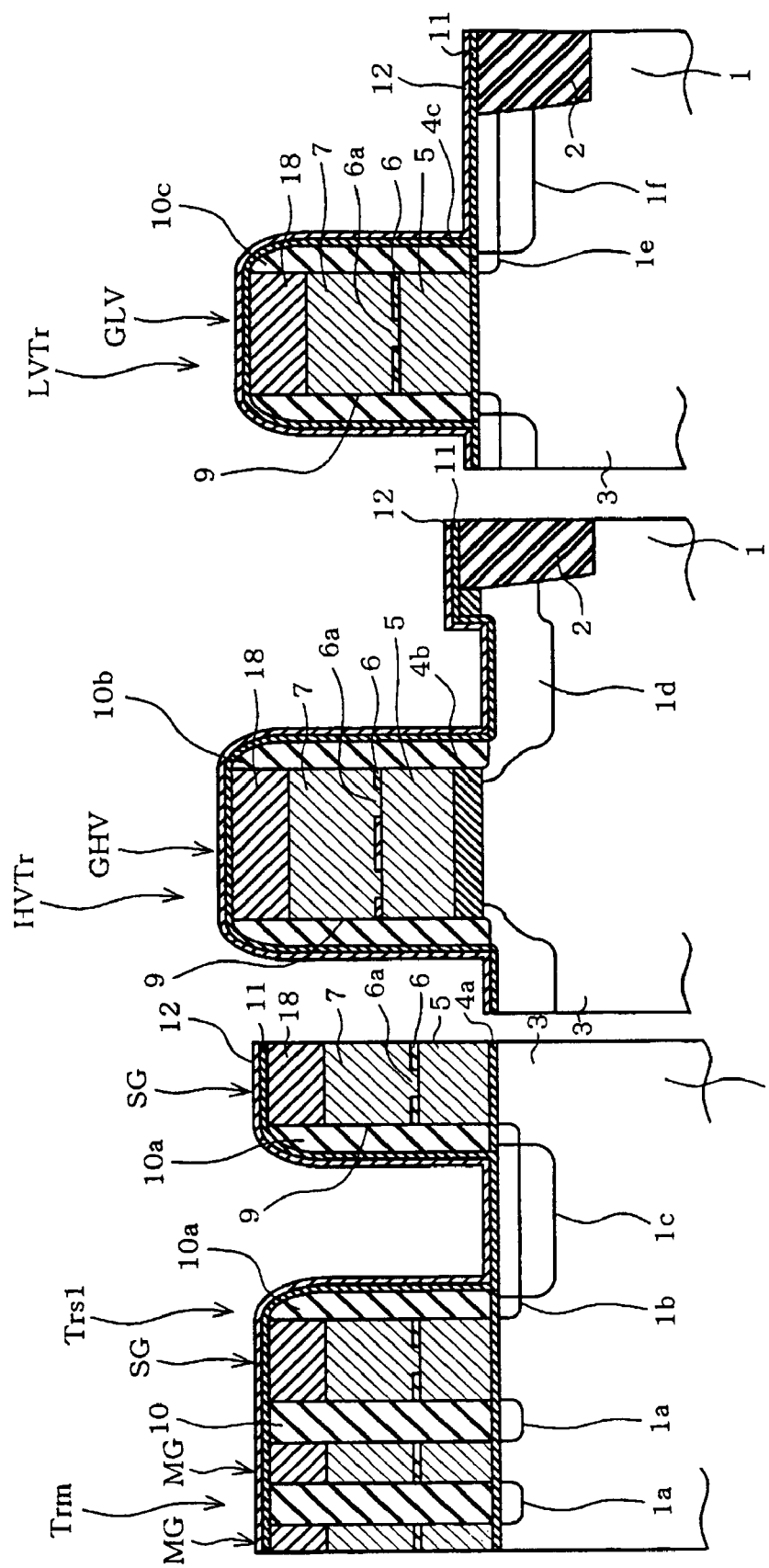
FIGS. 10A, 10B and 10C are schematic longitudinally sectional views of the memory cell region in one of the sequential steps of the fabricating process (No. 7)

Subsequently, as shown in FIGS. 9A to 9C, arsenic ion is implanted in a negative-channel metal oxide semiconductor (NMOS) and boron (B) is implanted in a positive-channel metal oxide semiconductor (PMOS) both for the forming of a diffusion layer in the source/drain region of each transistor at the density of $3.0 \times 10^{15}$ atoms/cm$^2$, whereupon N+/P+ layers 1C, 1d and 1f are formed. Subsequently, as shown in FIGS. 10A to 10C, a silicon oxide film 11 such as TEOS is deposited over the whole surface. The silicon oxide film 11 has a film thickness ranging from 10 to 20 nm, for example, 10 nm, and serves as a second silicon oxide film. Thereafter, a silicon nitride film 12 is deposited on the silicon oxide film 11. The silicon nitride film 12 is provided for preventing diffusion of impurities from the BPSG film 13 which is used to be buried between the gate electrodes and preventing diffusion of an oxidant during densification. The silicon oxide film 11 prevents the silicon nitride film 12 from direct contact with the silicon substrate 1, whereupon the reliability of the higher breakdown voltage can be improved.

Subsequently, as shown in FIGS. 11A to 11C, the BPSG film 13 is buried between the gate electrodes, and planarization is carried out by the CMP method with the silicon nitride film 12 serving as a stopper. As a result, the BPSG film 13 is buried between the gate electrodes SG and around the gate electrodes GHV and GLV so as to reach the same height as these gate electrodes. Subsequently, as shown in FIGS. 12A to 12C, the silicon oxide and nitride films 11 and 12 on the gate electrodes MG, SG, GHV and GLV are removed, and a silicon nitride film 18 serving as a cap material is etched back such that the polycrystalline silicon film 7 is exposed.

Figures 13A, 13B, 13C:
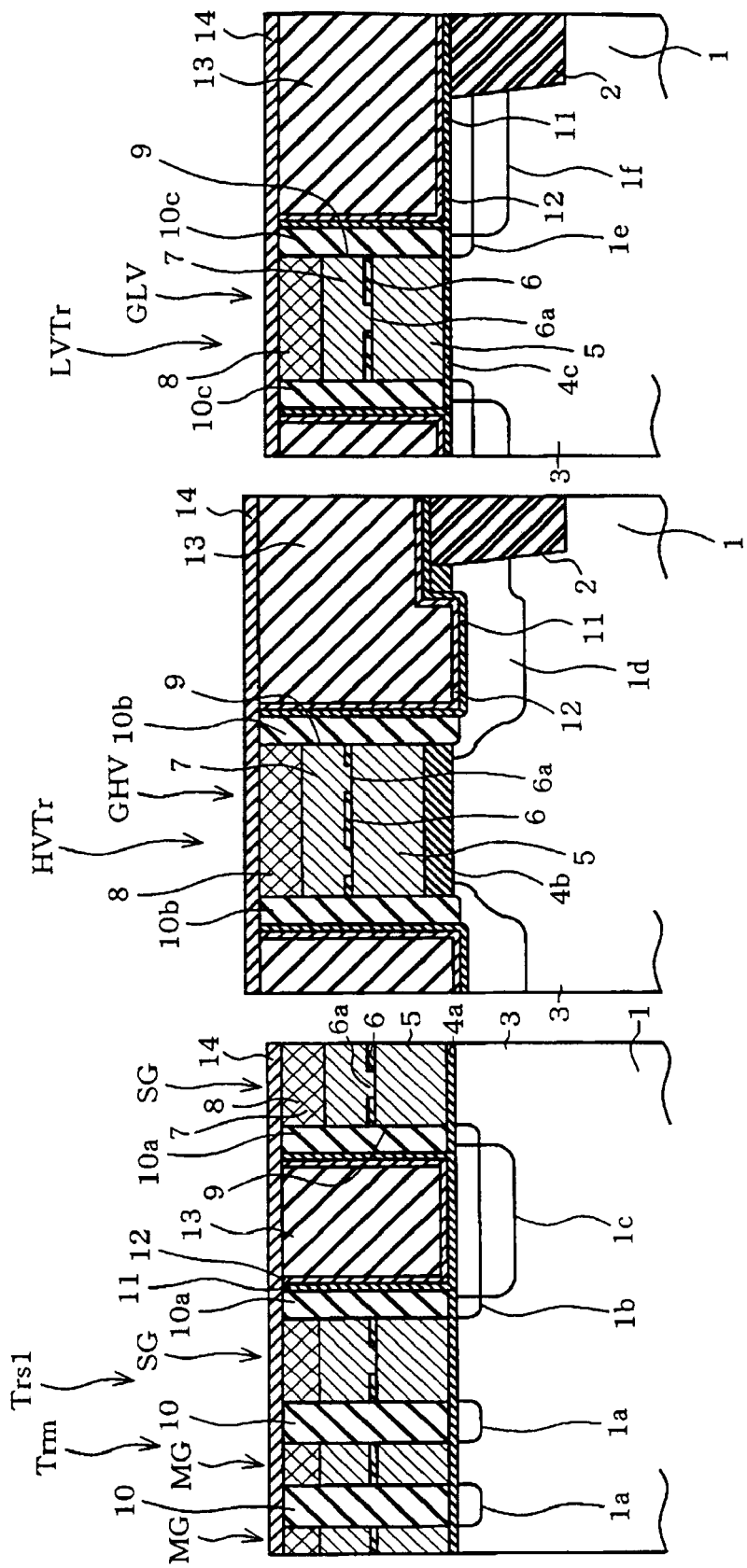
FIGS. 13A, 13B and 13C are schematic longitudinally sectional views of the memory cell region in one of the sequential steps of the fabricating process (No. 10)

Subsequently, as shown in FIGS. 13A to 13C, a silicide layer 8 is formed on the gate electrodes MG, SG, GHV and GLV. Thereafter, a silicon nitride film 14 is formed. Firstly, in the above-described state, a spontaneous oxide film or the like on the surface where the polycrystalline silicon film 7 serving as the control gate is removed by an oxide film removing technique such as dilute HF solution treatment. Subsequently, a cobalt film is formed for the forming of metal silicide by the sputtering technique. The formed cobalt film is annealed so that a cobalt silicide film 8 is formed. A lamp annealing technique such as rapid thermal processing (RTP) is employed for the annealing process. A part of the cobalt film in contact with the polycrystalline silicon film 7 is silicidated and the other part thereof remains unreactive. The unreactive part of the cobalt film is treated with a removing liquid thereby to be removed. Thereafter, the annealing process such as RTP is again carried out if necessary, whereupon the stable cobalt silicide (CoSi$_2$) film 8 is formed.

Subsequently, as shown in FIGS. 12A to 12C, the silicon nitride film 14 with the film thickness of about 30 nm is formed by the LPCVD technique as a barrier insulating film for preventing contamination by the silicide layer 8. The silicon nitride film 14 is formed so as to cover the upper surfaces of the cobalt silicide films 8 of the gate electrodes MG and SG, the upper surfaces of the silicon oxide films 10 between the gate electrodes MG and gate electrodes MG and SG and the upper surface of the silicon oxide film 13 between the gate electrodes SG. Furthermore, the silicon nitride film 14 is also formed so as to cover the upper surfaces of the gate electrodes of the respective transistors in the peripheral circuit region and the upper surface of the silicon oxide film 13.

Subsequently, as shown in FIGS. 14A to 14C, a TEOS film 15 with a film thickness of about 400 nm is formed by the CVD technique. Thereafter, the contact holes 16 are formed in the photolithography process by the RIE technique for the forming of the contact plugs 17. Subsequently, as shown in FIGS. 3A to 3C, a conductor is buried in the contact holes 16 so that the contact plugs 17 are formed. A dual damascene structure is employed in the forming of the contact plugs 17 in the peripheral circuit region. After formation of trenches 16a serving as wiring layers, the contact holes 16 and wiring trenches 16a are filled with tungsten (W) by the CVD method. Thereafter, fabrication continues to a multilayer wiring process to an upper layer although the process is not shown.

According to the above-described embodiment, the peripheral circuit region or particularly, the source/drain region in the forming area of the higher breakdown voltage transistor HVTr is configured so as to avoid directly contacting the source/drain region 1d. Consequently, hot carrier produced in the source/drain region 1d can be prevented from penetrating the silicon nitride film 12, whereupon the reliability of the transistors can be improved.

The inventor carried out a measurement and confirmed that when voltage stress was continued to be applied to the drain, deterioration of a threshold was improved in a configuration formed with the silicon nitride film 12 and the silicon oxide film 11 as in the foregoing embodiment as compared with a configuration with only the silicon nitride film 12 but no silicon oxide film 11. The configuration with no silicon oxide film 11 was deteriorated before lapse of 1000 sec. However, the threshold did not vary until lapse of several 1000 sec. in the configuration with the silicon nitride film 12 and the silicon oxide film 11. Thus, a stable state was confirmed.

Furthermore, regarding the dependency of the silicon oxide film 12 upon the film thickness, the inventor measured a deterioration rate of on current Ion which was measured after application of voltage stress to the drain. An improvement was confirmed when the film thickness was no less than 5 nm. A favorable characteristic was obtained when the film thickness was no less than 10 nm. When the film thickness is small, a tunnel current is expected. Accordingly, the silicon oxide film 12 needs the film thickness of no less that 5 nm. An upper limit of the film thickness is subjected to limitation in design since a rate of occupation of the film 12 between the gate electrodes is increased with increase in the film thickness.

One of the features of the foregoing configuration resides in two steps on the surface of the source/drain region 1d of the higher breakdown voltage transistor HVTr. The steps are due to silicon gouging caused by removal of the gate oxide film 4b in the process of forming the source/drain region 1d and silicon gouging caused in the process of forming the spacers of the silicon oxide film 10.

Furthermore, the silicon oxide film 10 is buried between the gate electrodes MG and gate electrodes MG and SG. No silicon nitride film 11 is provided between the gate electrodes MG and gate electrodes MG and SG. Consequently, the parasitic capacity can be reduced in the memory cell transistor as compared with the case where the silicon nitride film 11 having a larger dielectric constant than the silicon oxide film 10 is formed between the gate electrodes MG and gate electrodes MG and SG. Accordingly, an electrically stable operation can be ensured.

Impurities or moisture content can be prevented from entering the lower layer side since the first and second barrier insulating films 11 and 13 are formed. Furthermore, the reaction between the cobalt silicide film 8 and the insulating film can be suppressed. Additionally, since the first and second barrier insulating films 11 and 13 serve as stoppers in the etching process or CMP process, these films 11 and 13 can be utilized effectively in the forming step.

The invention should not be limited by the foregoing embodiment. The embodiment may be modified or expanded as follows. The film thickness of the silicon oxide film 11 serving as the second silicon oxide film may range from 5 to 30 nm. Furthermore, it is more favorable that the film thickness of the silicon oxide film 11 ranges from 10 to 20 nm.

Although the cobalt silicide film 8 is applied as the formation of the gate electrode MG in the memory cell in the foregoing embodiment, the same process can be applied to the case where the electrode comprises a tungsten silicide (SiW) film or another metal gate film.

The invention may be applied not only to the NAND flash memory but also to other semiconductor memory devices.

The foregoing description and drawings are merely illustrative of the principles of the present invention and are not to be construed in a limiting sense. Various changes and modifications will become apparent to those of ordinary skill in the art. All such changes and modifications are seen to fall within the scope of the invention as defined by the appended claims.

What is claimed is:

1. A nonvolatile semiconductor memory device comprising:
    a semiconductor substrate having an upper surface and a surface layer;
    a gate insulating film formed on the upper surface of the semiconductor substrate;
    a gate electrode formed on the gate insulating film and having a sidewall;
    a source/drain region formed at each side of the gate electrode on the surface layer of the semiconductor substrate respectively, the source/drain region including a first region, a second region and a third region located between the first and second regions;
    a contact plug formed on the second region of the source/drain region;
    a first silicon oxide film formed on the sidewall of the gate electrode so as to serve as an ion implantation spacer, the first silicon oxide film having a first lower surface in contact with the upper surface of the first region of the source/drain region and located lower than the upper surface of the semiconductor substrate where the gate insulating film is located;
    a second silicon oxide film formed on the third region of the source/drain region and a side surface of the first silicon oxide film, the second silicon oxide film having a second lower surface in contact with the upper surface of the source/drain region and located lower than the first lower surface of the first silicon oxide film; and
    a silicon nitride film formed on an upper surface of the second silicon oxide film, wherein the first silicon oxide film, the second oxide film having the silicon nitride film formed thereon, and the contact plug are contiguously arranged on said first, third and second regions of the source/drain region, and the contact plug extends through the second silicon oxide film and the second nitride film to contact the source/drain region.

2. The nonvolatile semiconductor memory device according to claim 1, wherein the first silicon oxide film has a film thickness of no less than 50 nm, and the second silicon oxide film has a film thickness ranging from 5 nm to 30 nm.

3. The nonvolatile semiconductor memory device according to claim 1, wherein the first silicon oxide film has a film thickness of no less than 50 nm, and the second silicon oxide film has a film thickness ranging from 10 nm to 20 nm.

4. The nonvolatile semiconductor memory device according to claim 1, further comprising an additional silicon nitride film formed on the upper surface of the gate electrode.

5. The nonvolatile semiconductor memory device according to claim 1, wherein the gate electrode includes a polycrystalline silicon film and a metal silicide layer.

6. The nonvolatile semiconductor memory device according to claim 5, wherein the metal silicide layer includes a cobalt silicide ($CoSi_2$) layer.

7. A nonvolatile semiconductor memory device comprising:
    a semiconductor substrate having an upper surface and a surface layer, the semiconductor substrate including a memory cell region having a pair of select gate transistors and a peripheral circuit region having a higher voltage transistor;
    a first gate insulating film formed on the upper surface of the semiconductor substrate in the memory cell region and having a first film thickness;
    a pair of first gate electrodes for the select gate transistor, formed on the first gate insulating film, each first gate electrode having a first sidewall facing the other first gate electrode;
    a second gate insulating film formed on the upper surface of the semiconductor substrate in the peripheral circuit region and having a second film thickness larger than the first film thickness;
    a second gate electrode for the higher voltage transistor, formed on the second gate insulating film, the second gate electrode including a pair of second sidewalls;
    a first source/drain region formed between the first gate electrodes on the surface layer of the semiconductor substrate;
    a plurality of first silicon oxide films formed on the first and the second sidewalls, each of the first silicon oxide films being formed on the second sidewalls having a first lower surface which is in contact with the upper surface of the semiconductor substrate and is located lower than the upper surface of the semiconductor substrate on which the second gate insulating film is formed;
    a second silicon oxide film formed on the surfaces of the first silicon oxide films, the second silicon oxide film formed in the peripheral circuit region having a second lower surface located lower than the lower surface of the first silicon oxide film; and
    a silicon nitride film formed on the upper surface of the second silicon oxide film.

8. The nonvolatile semiconductor memory device according to claim 7, wherein the first silicon oxide film has a film thickness of no less than 50 nm, and the second silicon oxide film has a film thickness ranging from 5 nm to 30 nm.

9. The nonvolatile semiconductor memory device according to claim 7, wherein the first silicon oxide film has a film thickness of no less than 50 nm, and the second silicon oxide film has a film thickness ranging from 10 nm to 20 nm.

10. The nonvolatile semiconductor memory device according to claim 7, further comprising an additional silicon nitride film formed on the upper surfaces of the first and second gate electrodes.

11. The nonvolatile semiconductor memory device according to claim 7, wherein each of the first and second gate electrodes includes a polycrystalline silicon film and a metal silicide layer.

12. The nonvolatile semiconductor memory device according to claim 11, wherein the metal silicide layer includes a cobalt silicide ($CoSi_2$) layer.

* * * * *